(12) United States Patent
Chen et al.

(10) Patent No.: US 12,383,982 B2
(45) Date of Patent: Aug. 12, 2025

(54) LAMINATED DEVICE WAFER FORMING METHOD

(71) Applicant: DISCO CORPORATION, Tokyo (JP)

(72) Inventors: Zhiwen Chen, Tokyo (JP); Kyosuke Kobinata, Tokyo (JP); Shunsuke Teranishi, Tokyo (JP); Akihito Kawai, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 677 days.

(21) Appl. No.: 17/811,196

(22) Filed: Jul. 7, 2022

(65) Prior Publication Data

US 2023/0020620 A1    Jan. 19, 2023

(30) Foreign Application Priority Data

Jul. 15, 2021    (JP) .................................. 2021-116854

(51) Int. Cl.
*B23K 26/38* (2014.01)
*B23K 26/046* (2014.01)
*H01L 21/02* (2006.01)

(52) U.S. Cl.
CPC ........ *B23K 26/38* (2013.01); *H01L 21/02021* (2013.01); *B23K 26/046* (2013.01)

(58) Field of Classification Search
None
See application file for complete search history.

(56) References Cited

U.S. PATENT DOCUMENTS

2010/0219500 A1*  9/2010  Morita ............. H01L 21/76254
                                                          257/506
2020/0111658 A1*  4/2020  Sugiya ................. B23K 26/354

FOREIGN PATENT DOCUMENTS

JP        2008153499 A      7/2008

* cited by examiner

*Primary Examiner* — Khaja Ahmad
(74) *Attorney, Agent, or Firm* — GREER BURNS & CRAIN, LTD.

(57) ABSTRACT

A laminated device wafer forming method includes a laminating step of laminating a first device wafer and a second device wafer to each other, the laminating step including a position adjusting step of imaging, by an imaging unit, a first predetermined line formed on a peripheral portion on the front surface side of the first device wafer and located outside rectangular regions corresponding to devices and a second predetermined line formed on a peripheral portion on the front surface side of the second device wafer and located outside the rectangular regions corresponding to the devices, and adjusting relative positions of the first device wafer and the second device wafer by using the first predetermined line and the second predetermined line.

6 Claims, 15 Drawing Sheets

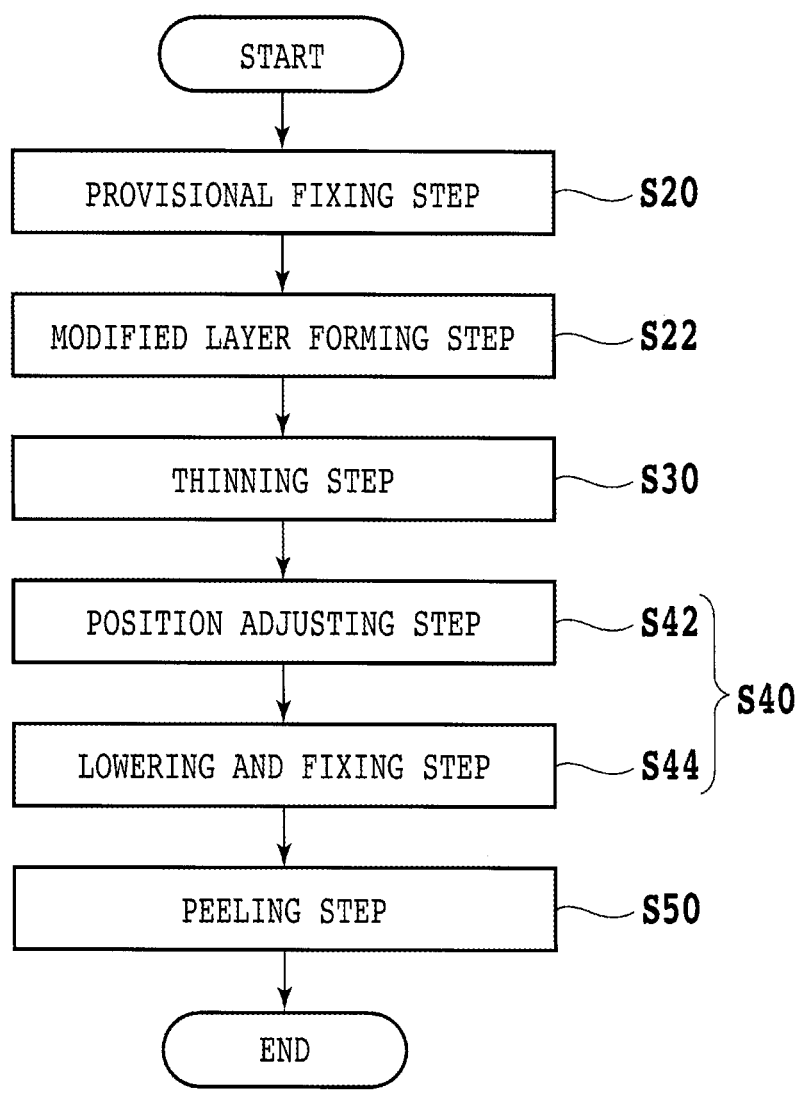

LAMINATED DEVICE WAFER FORMING METHOD

BACKGROUND OF THE INVENTION

Field of the Invention

The present invention relates to a laminated device wafer forming method for forming a laminated device wafer in which a plurality of device wafers are laminated.

Description of the Related Art

Recently, products having semiconductor devices including semiconductor device chips have been becoming increasingly reduced in size, thickness, and weight, as typified by mobile apparatuses such as smart phones and tablets. Accordingly, the semiconductor devices are also desired to have a smaller size, a smaller thickness, and a higher density. In order to meet this desire, a method has been proposed which manufactures a laminated multi-chip package (MCP) by laminating a first and a second semiconductor wafer each having a plurality of semiconductor devices formed thereon to each other via an adhesive layer into a laminated device wafer of a wafer on wafer (WOW) structure, and thereafter performing dicing or the like (see Japanese Patent Laid-Open No. 2008-153499, for example).

In Japanese Patent Laid-Open No. 2008-153499, in order for the first and second semiconductor device wafers to be accurately aligned with each other and laminated to each other, a thermal oxide film is first formed on the whole of a first and a second silicon wafer, and alignment marks are then formed within rectangular regions corresponding to device chips in the thermal oxide film by a photolithography process. The alignment marks have a function of indicating reference positions for elements or the like formed within the rectangular regions, and function also as positioning marks indicating the positions of the respective device wafers when the first and second semiconductor device wafers are aligned with each other.

However, a dedicated photomask for forming the alignment marks is needed to perform the photolithography process, and manufacturing cost is increased by an amount corresponding to the photolithography process. Further, the alignment marks do not contribute to functions of the semiconductor devices themselves. Thus, the presence of the alignment marks decreases an effective area in which semiconductor devices including a semiconductor circuit, a wiring layer, and the like can be formed.

SUMMARY OF THE INVENTION

The present invention has been made in view of such problems. It is an object of the present invention to align device wafers with each other and laminate the device wafers to each other without forming alignment marks for alignment within rectangular regions corresponding to device chips.

In accordance with an aspect of the present invention, there is provided a laminated device wafer forming method for forming a laminated device wafer in which a plurality of device wafers are laminated by laminating a first device wafer and a second device wafer to each other, the first device wafer and the second device wafer having a plurality of planned dividing lines set in a lattice manner on front surfaces of the first device wafer and the second device wafer and each having a device formed in each of a plurality of regions each in a rectangular shape, the plurality of regions being demarcated by the plurality of planned dividing lines. The laminated device wafer forming method includes a removing step of removing at least a chamfered portion formed on a peripheral portion on the front surface side of the first device wafer by processing the first device wafer, a thinning step of grinding and thinning a back surface side of the first device wafer after the removing step, and a laminating step of laminating the first device wafer and the second device wafer to each other after the thinning step. The laminating step includes a position adjusting step of imaging, by an imaging unit, a first predetermined line formed on a peripheral portion on the front surface side of the first device wafer and located outside the rectangular regions corresponding to the devices and a second predetermined line formed on a peripheral portion on the front surface side of the second device wafer and located outside the rectangular regions corresponding to the devices, and adjusting relative positions of the first device wafer and the second device wafer by using the first predetermined line and the second predetermined line.

Preferably, the laminating step laminates the back surface side of the first device wafer and the front surface side of the second device wafer to each other.

Preferably, the position adjusting step images the first predetermined line and the second predetermined line simultaneously by the imaging unit.

In addition, preferably, the first predetermined line is a first planned dividing line set on the front surface of the first device wafer, the second predetermined line is a second planned dividing line set on the front surface of the second device wafer, the first planned dividing line and the second planned dividing line have a same shape and a same size, and the position adjusting step aligns the first planned dividing line and the second planned dividing line with each other.

In addition, preferably, the position adjusting step adjusts the relative positions of the first device wafer and the second device wafer by using, in addition to the first predetermined line and the second predetermined line, a third predetermined line set in orthogonal positional relation to the first predetermined line, formed on the peripheral portion on the front surface side of the first device wafer, and located outside the rectangular regions corresponding to the devices, and a fourth predetermined line set in orthogonal positional relation to the second predetermined line, formed on the peripheral portion on the front surface side of the second device wafer, and located outside the rectangular regions corresponding to the devices.

In accordance with another aspect of the present invention, there is provided a laminated device wafer forming method for forming a laminated device wafer in which a plurality of device wafers are laminated by laminating a first device wafer and a second device wafer to each other, the first device wafer and the second device wafer having a plurality of planned dividing lines set in a lattice manner on front surfaces of the first device wafer and the second device wafer and each having a device formed in each of a plurality of rectangular regions demarcated by the plurality of planned dividing lines. The laminated device wafer forming method includes a modified layer forming step of positioning a condensing point of a laser beam having a wavelength transmitted through the first device wafer at a predetermined depth in a thickness direction of the first device wafer in a peripheral portion of the first device wafer, and forming a modified layer, a thinning step of grinding and thinning a back surface side of the first device wafer and removing the peripheral portion of the first device wafer after the modified layer forming step, and a laminating step of laminating the first device wafer and the second device wafer to each other after the thinning step. The laminating step includes a position adjusting step of imaging, by an imaging unit, a first predetermined line formed on a peripheral portion on the front surface side of the first device wafer and located outside the rectangular regions corresponding to the devices and a second predetermined line formed on a peripheral portion on the front surface side of the second device wafer and located outside the rectangular regions corresponding to the devices, and adjusting relative positions of the first device wafer and the second device wafer by using the first predetermined line and the second predetermined line.

In the laminated device wafer forming method according to the present invention, the first device wafer and the second device wafer are laminated to each other (laminating step). The laminating step includes a position adjusting step. The position adjusting step images, by an imaging unit, a first predetermined line formed on a peripheral portion on the front surface side of the first device wafer and located outside the rectangular regions corresponding to the devices and a second predetermined line formed on a peripheral portion on the front surface side of the second device wafer and located outside the rectangular regions corresponding to the devices, and adjusts relative positions of the first device wafer and the second device wafer by using the first predetermined line and the second predetermined line. That is, the device wafers can be aligned with each other without alignment marks for alignment being formed within the rectangular regions corresponding to the devices in order to make positional adjustment of the device wafers. Hence, in addition to being able to omit a photolithography process for forming the alignment marks, the effective area of the devices is not decreased by the alignment marks.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIG. 10 is a flowchart of a laminated device wafer forming method according to a second embodiment;

DETAILED DESCRIPTION OF THE PREFERRED EMBODIMENTS

First Embodiment

Figure 1A:
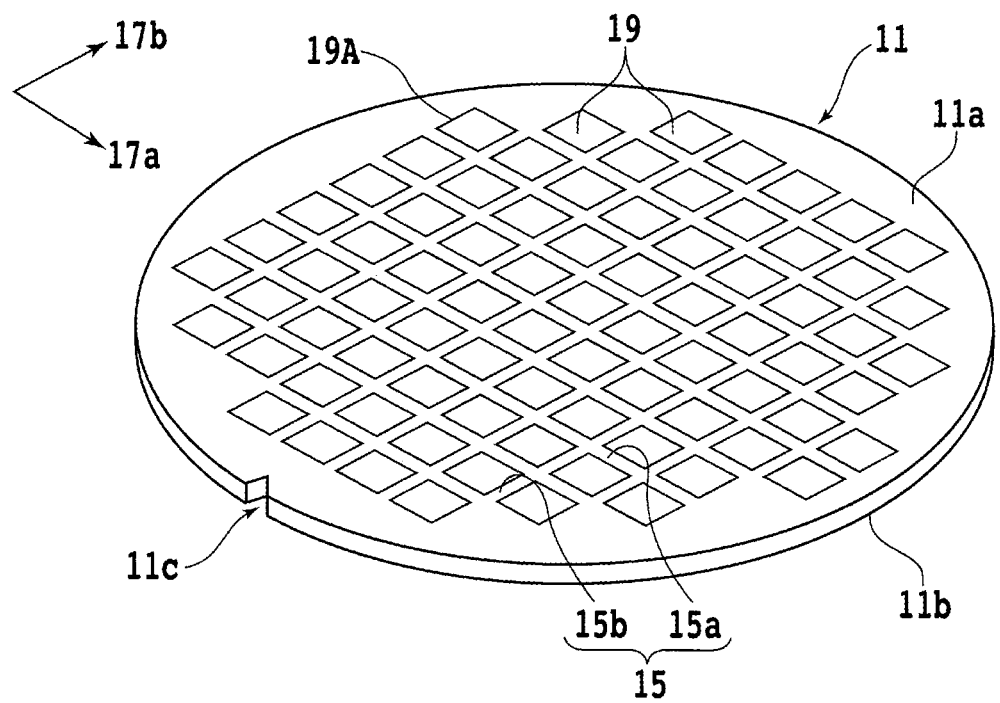
FIG. 1A is a perspective view of a first device wafer.
Figure 1B:
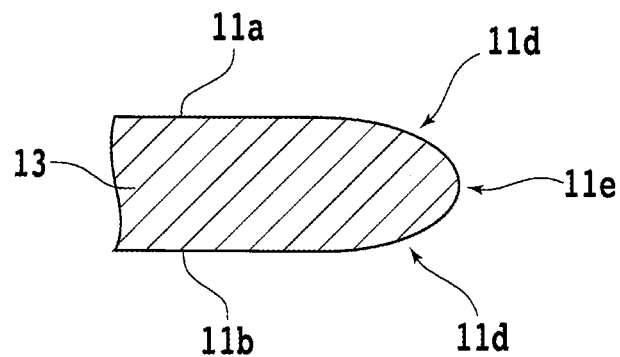
FIG. 1B is a sectional view of a peripheral portion of the first device wafer.

An embodiment according to one aspect of the present invention will be described with reference to the accompanying drawings. Description will first be made of a first device wafer 11 (see FIGS. 1A and 1B) and a second device wafer 21 (see FIG. 5). However, both have substantially a same shape, and therefore description will be made of the first device wafer 11. FIG. 1A is a perspective view of the first device wafer 11. FIG. 1B is a sectional view of a peripheral portion of the first device wafer 11. The first device wafer 11 includes a disk-shaped wafer 13 formed mainly of silicon.

A plurality of planned dividing lines (streets) 15 are set in a lattice manner on a front surface 11a of the first device wafer 11 (which front surface corresponds to a front surface of the wafer 13). The plurality of planned dividing lines 15 include a plurality of planned dividing lines 15a each parallel with a first direction 17a. A plurality of planned dividing lines 15b each parallel with a second direction 17b orthogonal to the first direction 17a intersect the plurality of planned dividing lines 15a. The plurality of planned dividing lines 15a and 15b demarcate the front surface 11a into a plurality of rectangular regions 19A.

A device 19 such as an integrated circuit (IC) is formed on the front surface 11a side of each rectangular region 19A. A notch 11c indicating the crystal orientation of the wafer 13 is formed in a peripheral portion of the first device wafer 11. In addition, a chamfered portion 11d is formed on each of a peripheral portion on the front surface 11a side and a peripheral portion on a back surface 11b side. A peripheral edge 11e that defines a diameter of the wafer 13 is present between the chamfered portion 11d on the front surface 11a side and the chamfered portion 11d on the back surface 11b side in a thickness direction of the wafer 13. Incidentally, while the second device wafer 21 has substantially the same shape as that of the first device wafer 11, a structure of the devices 19 of the second device wafer 21 and the structure of the devices 19 of the first device wafer 11 may be identical to each other or may be different from each other.

Figure 2:
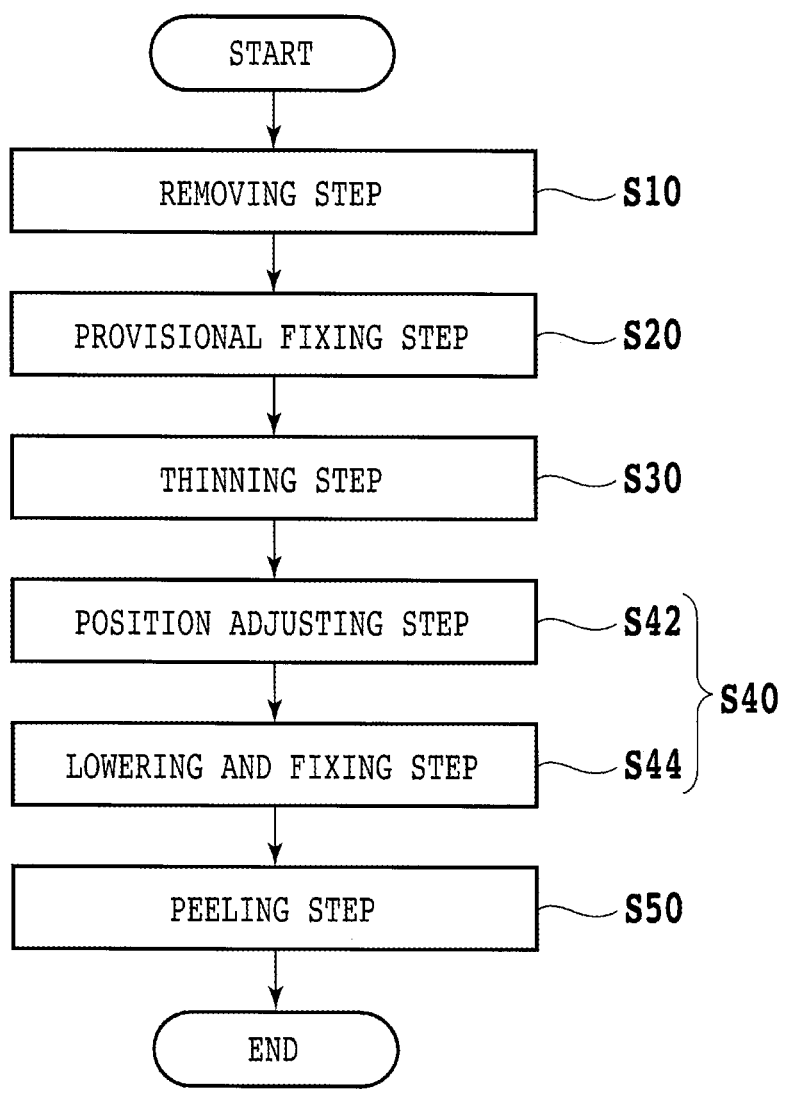
FIG. 2 is a flowchart of a laminated device wafer forming method.

Next, referring to FIGS. 2 to 9B, description will be made of a method of forming a laminated device wafer 23 (see FIG. 9B), which method forms the laminated device wafer 23 in which the first device wafer 11 and the second device wafer 21 are laminated. FIG. 2 is a flowchart of the method of forming the laminated device wafer 23 according to a first embodiment. First, the chamfered portion 11d formed on the peripheral portion on the front surface 11a side of the first device wafer 11 is removed by cutting (processing) the peripheral portion of the first device wafer 11 (removing step S10).

Figure 3A:
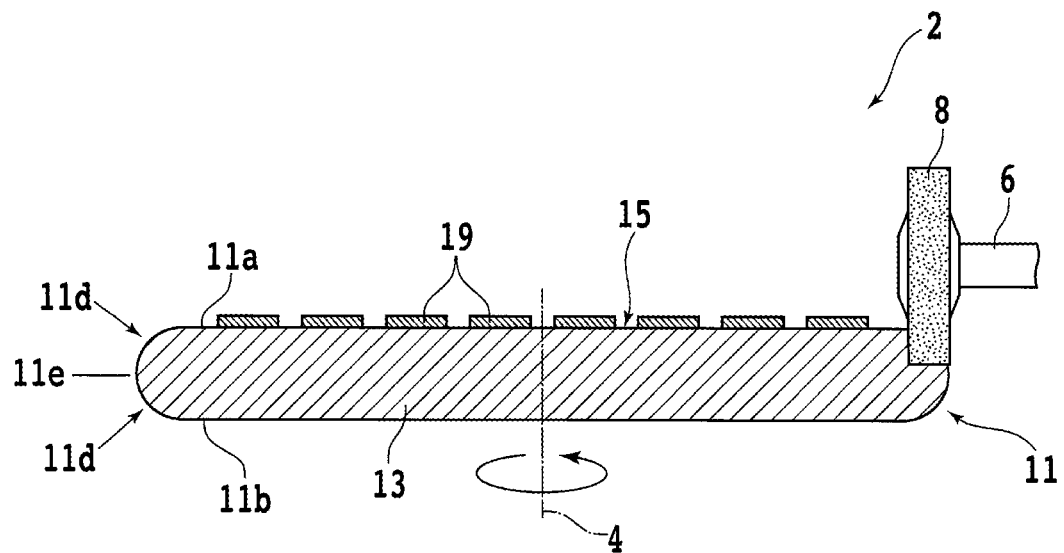
FIG. 3A is a partially sectional side view depicting a removing step.

FIG. 3A is a partially sectional side view depicting the removing step S10. A cutting apparatus 2 is used in the removing step S10. The cutting apparatus 2 has a disk-shaped chuck table (not depicted). The upper surface of the chuck table functions as a substantially flat holding surface. A negative pressure is transmitted from a suction source (not depicted) such as an ejector to the holding surface. A rotational driving source (not depicted) such as a motor is connected to a lower portion of the chuck table. The chuck table is rotatable by the rotational driving source about a predetermined rotational axis 4 disposed substantially in parallel with a cutting feed direction (for example, a Z-axis direction).

A cutting unit is disposed above the chuck table. The cutting unit is configured to be movable in the cutting feed direction by a ball screw type cutting feed unit (not depicted). Further, the cutting unit is configured to be movable in an indexing feed direction (for example, a Y-axis direction) by a ball screw type indexing feed unit (not depicted). The cutting unit has a square tubular spindle housing (not depicted) whose longitudinal direction is disposed along the indexing feed direction.

The spindle housing rotatably houses a part of a cylindrical spindle 6. A proximal end portion of the spindle 6 is provided with a rotational driving source (not depicted) such as a motor. A distal end portion of the spindle 6 projects from the spindle housing. This distal end portion is fitted with a cutting blade 8 having an annular cutting edge. In the removing step S10, first, the back surface 11b side of the first device wafer 11 is sucked and held by the holding surface. Next, while cutting water such as pure water is supplied to the cutting blade 8, a lower end portion of the cutting blade 8 rotated at a high speed (for example, approximately 30,000 rpm) is made to cut into the peripheral portion on the front surface 11a side, and the chuck table is rotated at a predetermined speed (for example, 3°/s (that is, 180°/min)).

Figure 3B:
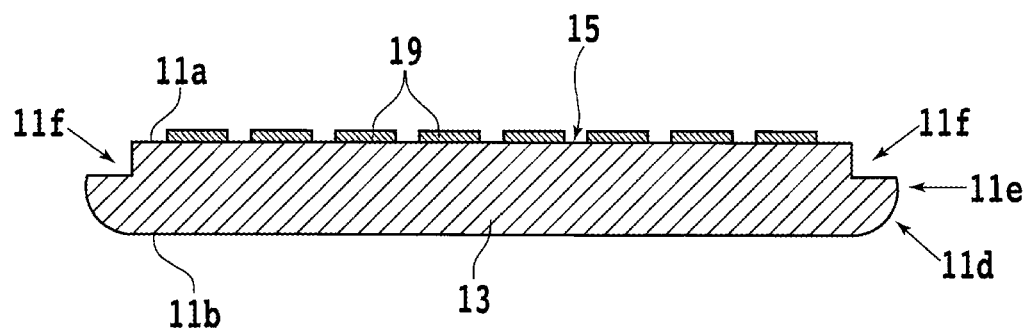
FIG. 3B is a sectional view of the first device wafer after the removing step.

Consequently, the chamfered portion 11d on the front surface 11a side is removed, and an annular stepped portion 11f is formed on the front surface 11a side. FIG. 3B is a sectional view of the first device wafer 11 after the removing step S10. Incidentally, the removing step S10 removes at least the chamfered portion 11d on the front surface 11a side. Alternatively, however, the cutting depth of the cutting blade 8 may be positioned at substantially the same height as that of the back surface 11b, and the respective chamfered portions 11d on the front surface 11a side and the back surface 11b side may be removed.

After the removing step S10, a provisional adhesive such as an ultraviolet curable resin or a thermoplastic resin is applied to a provisional fixing substrate 33 (see FIG. 4A) by using a spinner coating apparatus (not depicted). After a provisional adhesive layer 35 (see FIG. 4A) is thereby formed, the provisional fixing substrate 33 in a disk shape is fixed to the front surface 11a side via the provisional adhesive layer 35 (provisional fixing step S20). In the present embodiment, a glass substrate transparent to visible light is used as the provisional fixing substrate 33. Alternatively, however, a silicon substrate may be used as the provisional fixing substrate 33. Incidentally, the silicon substrate is transparent to infrared rays. Thus, in a case where the silicon substrate is used, an infrared camera is used in a microscope camera unit 32 to be described later.

Figure 4A:
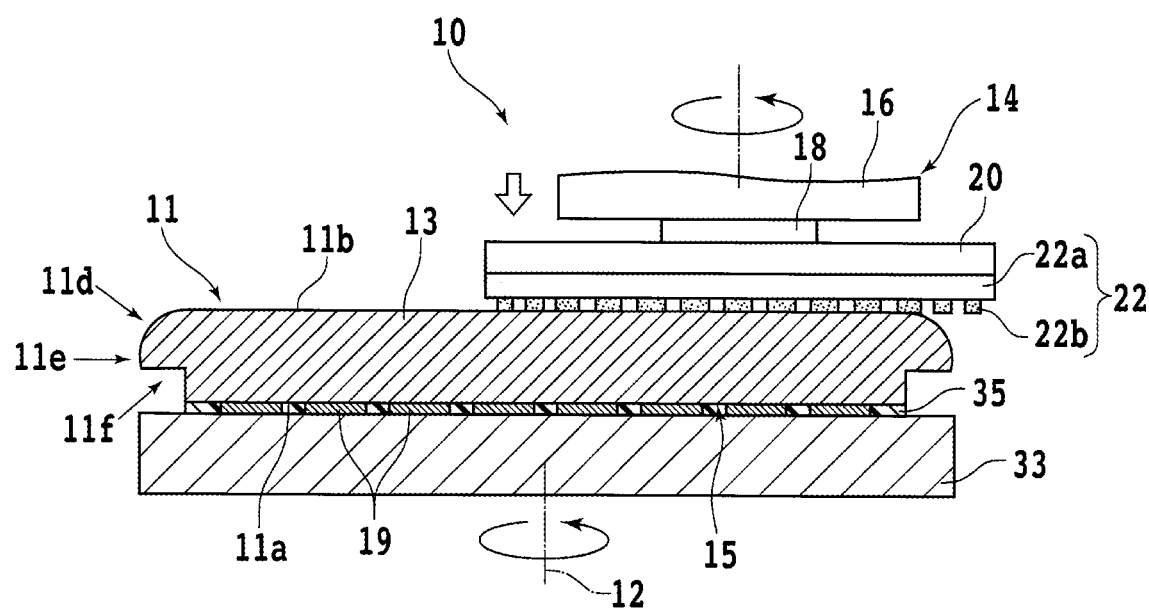
FIG. 4A is a partially sectional side view depicting a thinning step.

After the provisional fixing substrate 33 is sucked and held by a first chuck table, the first device wafer 11 is thinned by grinding the back surface 11b side (thinning step S30). FIG. 4A is a partially sectional side view of the first device wafer 11 and a grinding and polishing apparatus 10, the side view depicting the thinning step S30. The grinding and polishing apparatus 10 has a disk-shaped first chuck table (not depicted). The first chuck table is rotatable about a predetermined rotational axis 12 by a rotational driving source such as a motor.

A rough grinding unit 14 is provided above the first chuck table. The rough grinding unit 14 is configured to be movable in a grinding feed direction (for example, the Z-axis direction) by a ball screw type grinding feed unit (not depicted). The rough grinding unit 14 includes a cylindrical spindle housing 16 whose longitudinal direction is disposed along the grinding feed direction. The spindle housing 16 rotatably houses a part of a cylindrical spindle 18. An upper end portion of the spindle 18 is provided with a rotational driving source (not depicted) such as a motor. A lower end portion of the spindle 18 projects from the spindle housing 16. The upper surface side of a disk-shaped mount 20 is fixed to the lower end portion.

The lower surface side of the mount 20 is fitted with an annular rough grinding wheel 22. The rough grinding wheel 22 includes an annular wheel base 22a. A plurality of rough grinding stones 22b each in a block shape are discretely arranged on the lower surface side of the wheel base 22a along the circumferential direction of the wheel base 22a. The grinding and polishing apparatus 10 further includes a second chuck table (not depicted) that is disposed so as to be adjacent to the first chuck table and has substantially the same structure as that of the first chuck table. The second chuck table is also similarly rotatable about a predetermined rotational axis.

A finish grinding unit (not depicted) is provided above the second chuck table. The finish grinding unit includes, in place of the rough grinding stones 22b, finish grinding stones (not depicted) including abrasive grains having an average grain diameter smaller than that of the rough grinding stones 22b. The grinding and polishing apparatus 10 further includes a third chuck table (not depicted) that is disposed so as to be adjacent to the first and second chuck tables and has substantially the same structure as that of the first chuck table. The third chuck table is also similarly rotatable about a predetermined rotational axis. A polishing unit (not depicted) is provided above the third chuck table. The polishing unit includes a disk-shaped polishing pad (not depicted) in place of the rough grinding wheel 22.

In the thinning step S30, first, the first chuck table is rotated about the rotational axis 12 at a predetermined speed (approximately 300 rpm, for example), and the rough grinding wheel 22 is rotated at a predetermined speed (for example, approximately 3,000 rpm) with the spindle 18 as a rotary shaft. The back surface 11b side is roughly ground by grinding-feeding the rough grinding unit 14 downward while grinding water such as pure water is supplied from the rough grinding wheel 22 to a processing point. After the rough grinding is performed until a predetermined thickness is obtained, the back surface 11b side is finish-ground by using the second chuck table and the finish grinding unit.

After the finish grinding, the back surface 11b side is subjected to chemical mechanical polishing (CMP) by using the third chuck table and the polishing unit. After undergoing the rough grinding, the finish grinding, and the polishing, the wafer 13 is thinned such that a thickness from the back surface 11b to outermost surfaces of the devices 19 is approximately 10 µm, and a grinding trace (saw mark) is removed. When the back surface 11b side is ground and polished to a position corresponding to the stepped portion 11f in the thinning step S30, an outside diameter of the first device wafer 11 becomes smaller than the outside diameter thereof defined by the peripheral edge 11e before the thinning step S30.

Figure 4B:
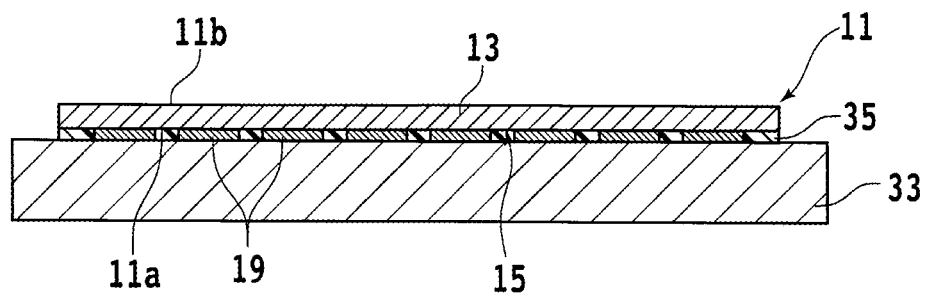
FIG. 4B is a sectional view of the first device wafer and the like after the thinning step.

FIG. 4B is a sectional view of the first device wafer 11 and the like after the thinning step S30. After the thinning step S30, the back surface 11b side of the first device wafer 11 and the front surface 21a side of the second device wafer 21 are laminated to each other via an adhesive (laminating step S40). A laminating apparatus 30 (see FIG. 5) is used in the laminating step S40. The laminating apparatus 30 has a vacuum chamber (not depicted). A disk-shaped holding unit (not depicted) that sucks and holds the provisional fixing substrate 33 is provided within the vacuum chamber.

The holding unit includes a porous body. A negative pressure is transmitted from a suction source such as an ejector to the porous body. In addition, the holding unit is configured to be movable along the Z-axis direction (upward-downward direction) by a Z-axis direction moving mechanism (not depicted) connected to the holding unit. A microscope camera unit (imaging unit) 32 is provided in the vicinity of the holding unit. The microscope camera unit 32 includes a lens, an imaging element, or the like, and has a depth of focus of approximately 20 µm to 30 µm.

The microscope camera unit 32 is configured to be movable in the X-axis, Y-axis, and Z-axis directions above the provisional fixing substrate 33 sucked by the holding unit. A holding table (not depicted) is provided below the holding unit and the microscope camera unit 32. The holding table is configured to be movable along the X-axis and Y-axis directions by an X-axis direction moving mechanism and a Y-axis direction moving mechanism that are each of a ball screw type (neither is depicted). Further, the holding table is configured to be rotatable about a rotational axis along the Z-axis direction in a predetermined angle range (that is, adjustable in a θ direction). In addition, the holding table is also provided with a heating source (not depicted) such as a heater.

In the laminating step S40, first, an adhesive made of a resin such as benzocyclobutene is applied to the back surface 11b side of the first device wafer 11 by using a spinner coating apparatus (not depicted). An adhesive layer 37 having a predetermined thickness (for example, a thickness less than 10 µm) is thereby formed. Then, the first device wafer 11 and the provisional fixing substrate 33 are sucked and held by the holding unit such that the adhesive layer 37 faces downward. Thereafter, the inside of the vacuum chamber is decompressed, the back surface 21b side of the second device wafer 21 is held by the holding table using a holding ring (not depicted) or the like, and the holding unit sucking and holding the provisional fixing substrate 33 is moved downward.

Figure 5:
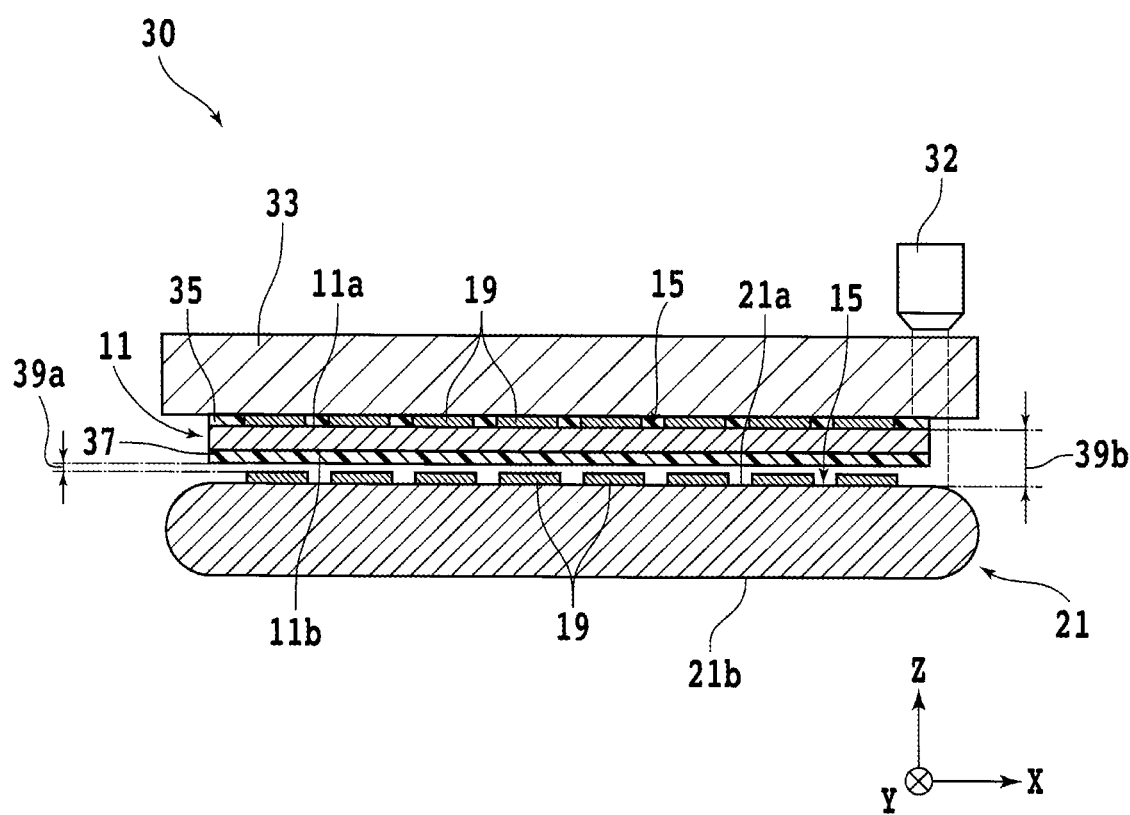
FIG. 5 is a partially sectional side view depicting a position adjusting step.

Then, the front surface 21a of the second device wafer 21 and the adhesive layer 37 are made to face and approach each other such that upper ends of the devices 19 on the front surface 21a side and the adhesive layer 37 are separated from each other by at least a distance 39a of a few micrometers (see FIG. 5). At this time, the front surface 11a and front surface 21a are located at an approaching distance 39b from each other to such a degree as to be able to be imaged by the microscope camera unit 32 at the same time. Next, a peripheral portion on the front surface 11a side of the first device wafer 11 and a peripheral portion on the front surface 21a side of the second device wafer 21 are imaged by the microscope camera unit 32, and the relative position of the second device wafer 21 with respect to the first device wafer 11 is adjusted (position adjusting step S42).

Figure 6:
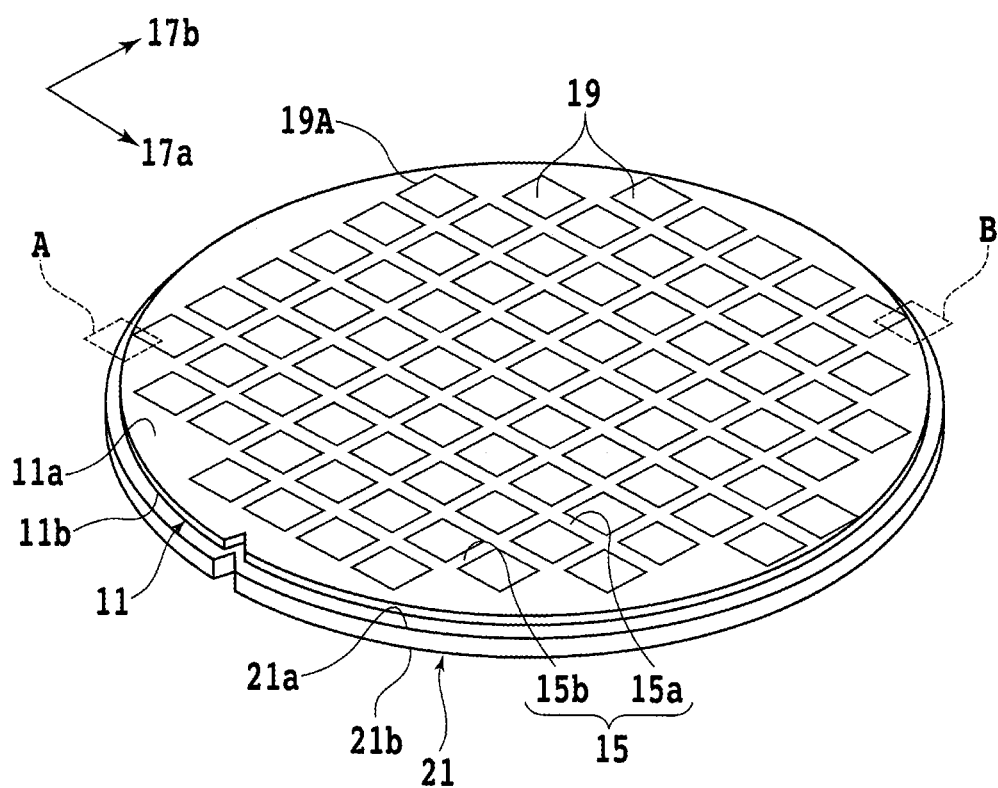
FIG. 6 is a perspective view of the first device wafer and a second device wafer.

FIG. 5 is a partially sectional side view depicting the position adjusting step S42. FIG. 6 is a perspective view of the first device wafer 11 and the second device wafer 21 in the position adjusting step S42. Incidentally, the provisional fixing substrate 33 and the provisional adhesive layer 35 are omitted in FIG. 6. The position adjusting step S42 of the present embodiment simultaneously images a first planned dividing line (first predetermined line) $15a_1$ formed in a peripheral portion of the front surface 11a and parallel with the first direction 17a and a second planned dividing line (second predetermined line) $15a_2$ formed in a peripheral portion of the front surface 21a and parallel with the first direction 17a.

The first planned dividing line $15a_1$ and the second planned dividing line $15a2$ indicate a dividing position at a time of dividing the wafer 13 into units of the devices 19 and are located outside the rectangular regions 19A corresponding to the devices 19. A difference from the above-described alignment marks for alignment lies in this respect.

Figure 7A:
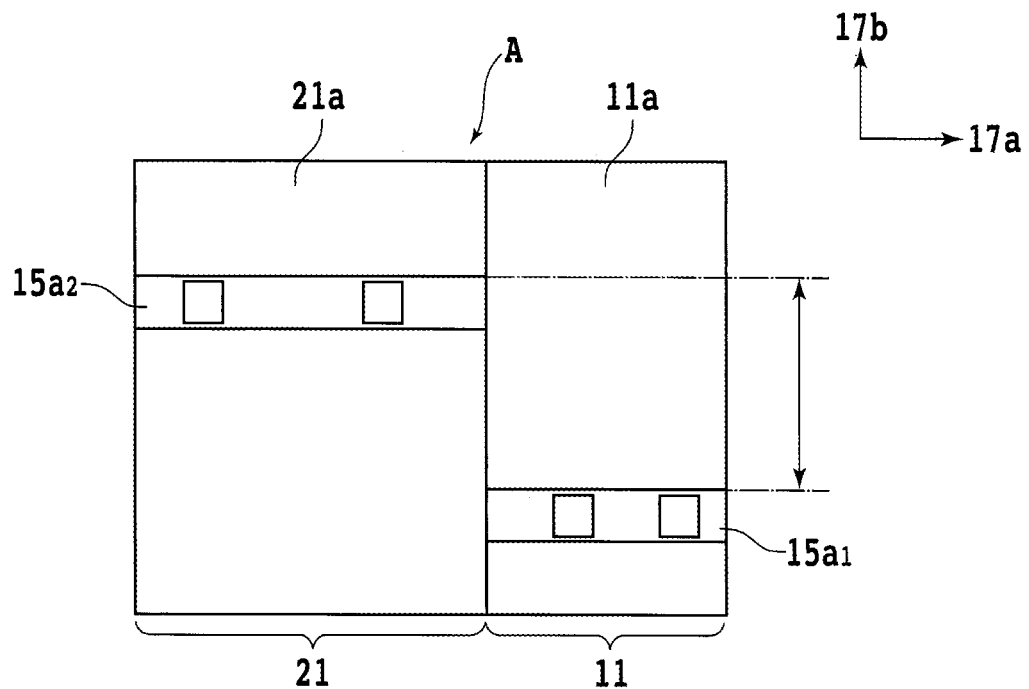
FIG. 7A is a schematic diagram of an image in a region A in a case where the positions of a first and a second planned dividing line are displaced from each other.
Figure 7B:
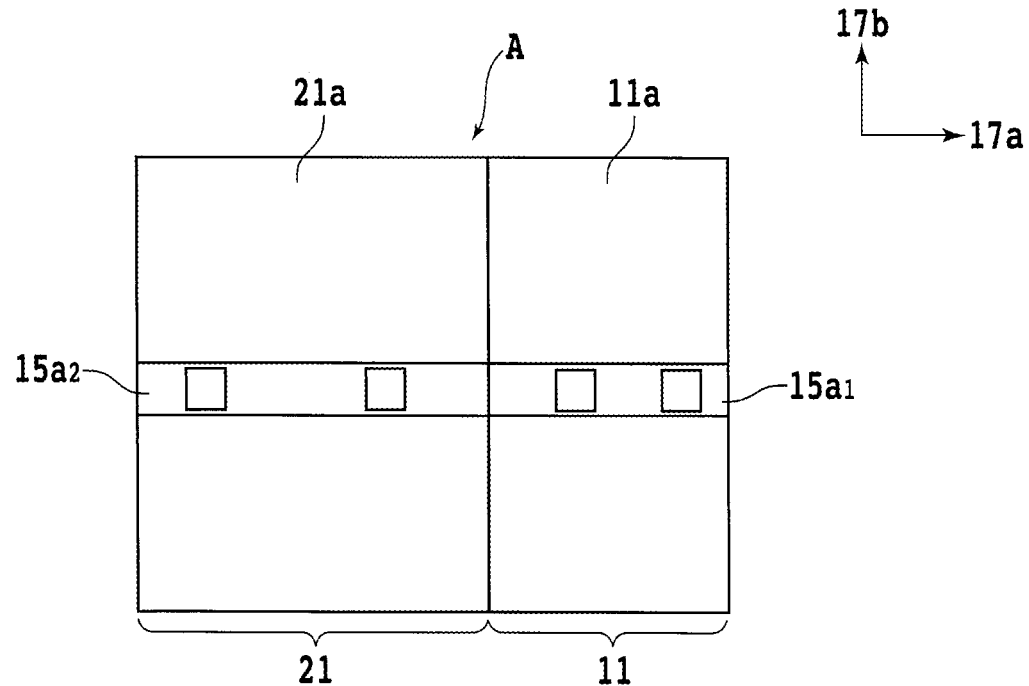
FIG. 7B is a schematic diagram of an image in the region A in a case where the positions of the first and second planned dividing lines coincide with each other.

FIG. 7A is a schematic diagram of an image in a region A in a case where the position of the first planned dividing line $15a_1$ and the position of the second planned dividing line $15a2$ are displaced from each other in the second direction 17b. In the case of FIG. 7A, the first planned dividing line $15a_1$ and the second planned dividing line $15a2$ are aligned with each other in the second direction 17b by moving the second device wafer 21 in the second direction 17b. FIG. 7B is a schematic diagram of an image in the region A in a case where the position of the first planned dividing line $15a_1$ and the position of the second planned dividing line $15a2$ coincide with each other in the second direction 17b. The first planned dividing line $15a_1$ and the second planned dividing line $15a_2$ have a same shape and a same size (width) and are therefore suitable as marks for alignment.

Next, the microscope camera unit 32 is positioned at a region B (see FIG. 6). Then, a third planned dividing line (third predetermined line) $15b_3$ in orthogonal positional relation to the first planned dividing line $15a_1$ and a fourth planned dividing line (fourth predetermined line) $15b_4$ in orthogonal positional relation to the second planned dividing line $15a_2$ are imaged simultaneously. Of course, the third planned dividing line $15b_3$ is formed on the peripheral portion on the front surface 11a side, and the fourth planned dividing line $15b_4$ is formed on the peripheral portion on the front surface 21a side. In addition, the third planned dividing line $15b_3$ and the fourth planned dividing line $15b_4$ are also located outside the rectangular regions 19A corresponding to the devices 19.

Figure 8A:
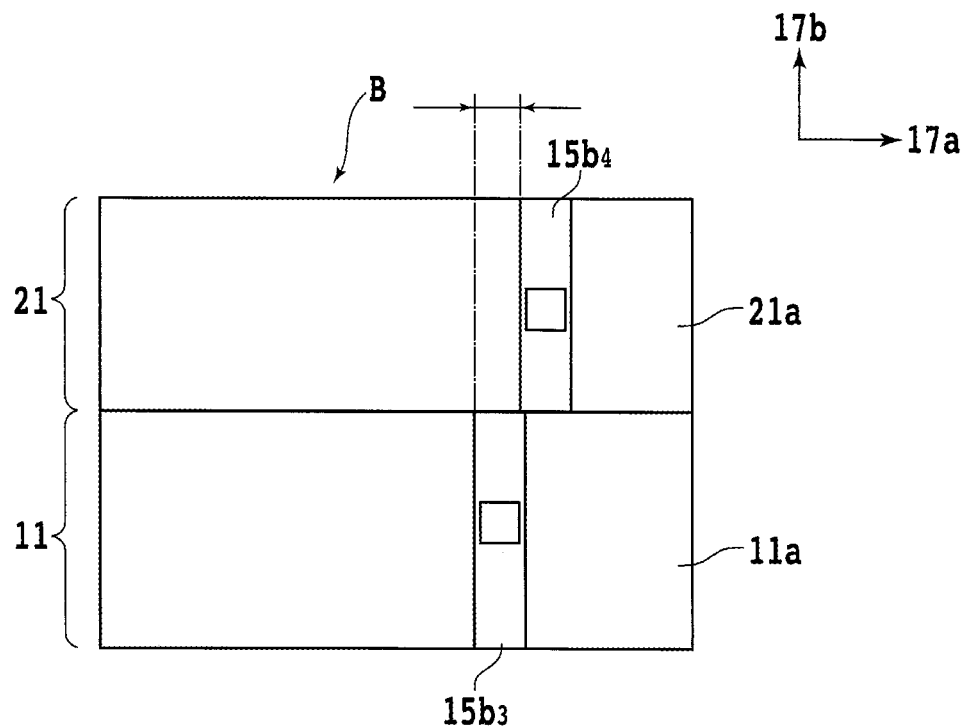
FIG. 8A is a schematic diagram of an image in a region B in a case where the positions of a third and a fourth planned dividing line are displaced from each other.
Figure 8B:
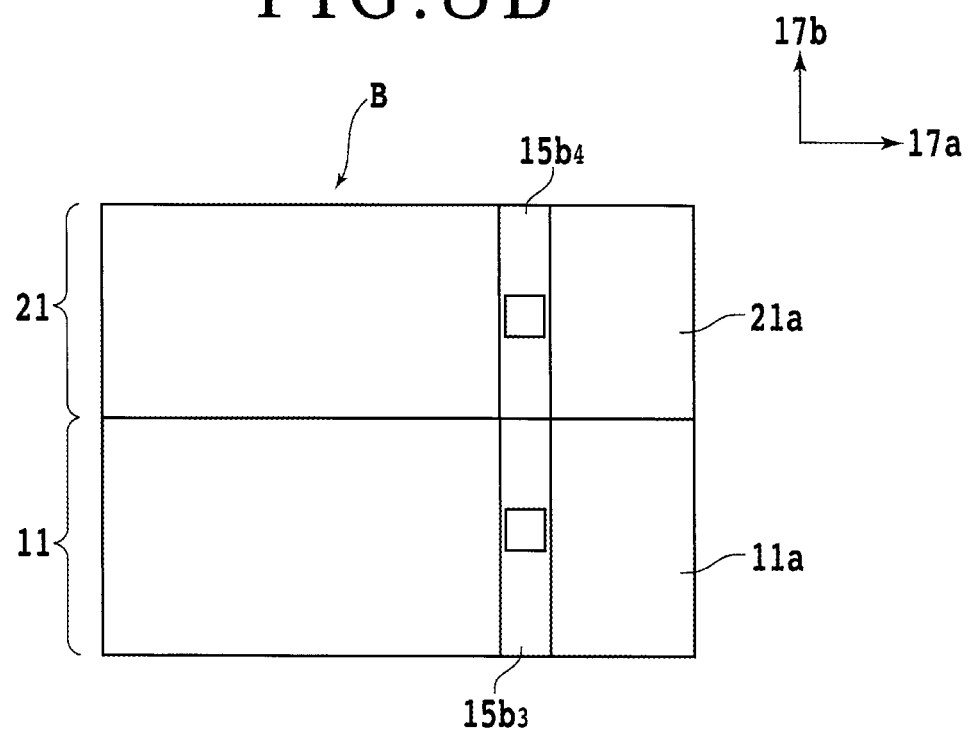
FIG. 8B is a schematic diagram of an image in the region B in a case where the positions of the third and fourth planned dividing lines coincide with each other.

FIG. 8A is a schematic diagram of an image in the region B in a case where the position of the third planned dividing line $15b3$ and the position of the fourth planned dividing line $15b_4$ are displaced from each other. In the case of FIG. 8A, the third planned dividing line $15b_3$ and the fourth planned dividing line $15b_4$ are aligned with each other in the first direction $17a$ by moving the second device wafer 21 in the first direction $17a$. FIG. 8B is a schematic diagram of an image in the region B in a case where the position of the third planned dividing line $15b_3$ and the position of the fourth planned dividing line $15b_4$ coincide with each other. The third planned dividing line $15b_3$ and the fourth planned dividing line $15b_4$ have a same shape and a same size (width) and are therefore suitable as marks for alignment.

The positions of the first device wafer 11 and the second device wafer 21 can be accurately aligned with each other in the first direction $17a$ and the second direction $17b$ by making positional adjustment using the plurality of planned dividing lines 15 in orthogonal positional relation to one another, in particular. Incidentally, the region A and the region B are preferably separated from each other by ¼ of one round or more in the circumferential direction of the first device wafer 11. When the region A and the region B are thus separated from each other, displacements are detected easily as compared with a case where the region A and the region B are in proximity to each other.

Incidentally, in the position adjusting step S42, when there is a displacement in the θ direction, the displacement in the θ direction between the first device wafer 11 and the second device wafer 21 may be resolved by using respective planned dividing lines 15 on the front surface $11a$ side and the front surface $21a$ side. The position adjusting step S42 thus makes positional adjustment in the second direction $17b$ by using the first planned dividing line $15a_1$ and the second planned dividing line $15a_2$, and makes positional adjustment in the first direction $17a$ with the third planned dividing line $15b_3$ and the fourth planned dividing line $15b_4$ as a reference.

That is, the first device wafer 11 and the second device wafer 21 can be aligned with each other without alignment marks being formed within the rectangular regions 19A corresponding to the devices 19 for positional adjustment between the first device wafer 11 and the second device wafer 21. Hence, in addition to being able to omit a photolithography process for forming the alignment marks, there is an advantage in that the effective area of the devices 19 is not decreased by the alignment marks.

Figure 9A:
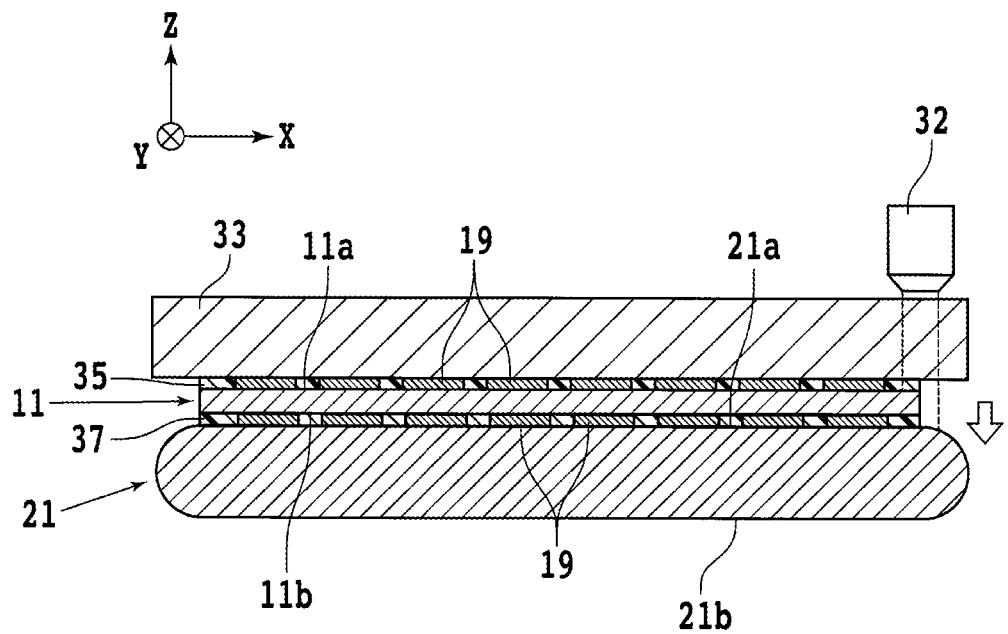
FIG. 9A is a partially sectional side view depicting a lowering and fixing step.

FIG. 9A is a partially sectional side view depicting a lowering and fixing step S44 after the position adjusting step S42. In the lowering and fixing step S44, the back surface $11b$ side is pressed against the front surface $21a$ side by lowering the provisional fixing substrate 33, and the adhesive layer 37 is solidified. For example, the adhesive layer 37 is solidified by heating the second device wafer 21 at 250° C. for approximately one hour in a state in which the back surface $11b$ side is pressed against the front surface $21a$ side. The first device wafer 11 and the second device wafer 21 are thereby bonded and fixed to each other.

Figure 9B:
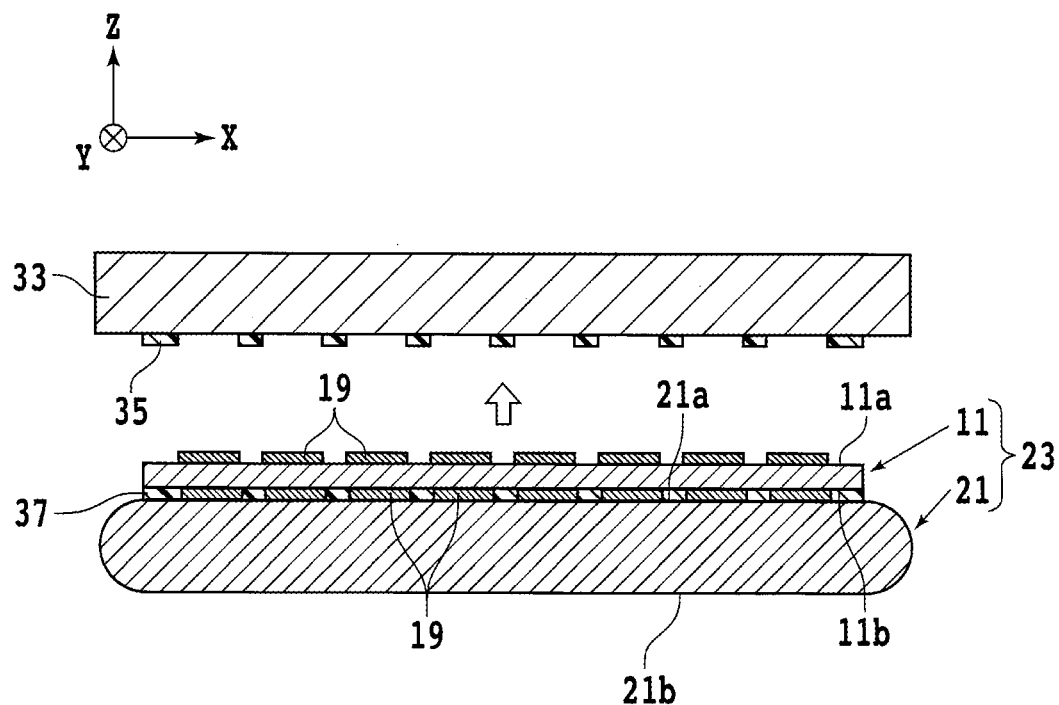
FIG. 9B is a sectional view of the first and second device wafers after removal of a provisional fixing substrate.

After the lowering and fixing step S44, the provisional fixing substrate 33 is peeled off from the front surface $11a$ side by decreasing the adhesive force of the provisional adhesive layer 35 (peeling step S50). FIG. 9B is a sectional view of the laminated device wafer 23 after the peeling step S50. In a case where the provisional adhesive is an ultraviolet curable resin, for example, the provisional fixing substrate 33 is peeled off after the adhesive force is reduced by irradiating the front surface $11a$ side with ultraviolet rays. The laminated device wafer 23 in which the first device wafer 11 and the second device wafer 21 are laminated to each other is thereby formed. In the present embodiment, the first device wafer 11 and the second device wafer 21 can be aligned with each other without alignment marks being formed within the rectangular regions 19A corresponding to the devices 19. Hence, a photolithography process for forming the alignment marks can be omitted, and the effective area of the devices 19 is not decreased by the alignment marks.

(First Modification)

In a case where a circuit pattern including the devices 19 on the front surface $11a$ side of the first device wafer 11 and a circuit pattern including the devices 19 on the front surface $21a$ side of the second device wafer 21 are mirror image objects, the front surface $11a$ side and the front surface $21a$ side can be laminated to each other. In this case, after the removing step S10, the front surface $11a$ side is protected by a protective tape (not depicted) made of a resin or the like, and thereafter the thinning step S30 is performed by grinding the back surface $11b$ side. Then, the provisional fixing substrate 33 is fixed to the back surface $11b$ side of the first device wafer 11 after the thinning step S30 via the provisional adhesive layer 35 (provisional fixing step).

Next, the adhesive layer 37 is formed on the front surface $11a$ side of the first device wafer 11. The adhesive layer 37 on the front surface $11a$ side and the front surface $21a$ of the second device wafer 21 are made to face and approach each other such that the adhesive layer 37 and the front surface $21a$ are separated from each other by at least the distance $39a$ of a few micrometers. Then, in the position adjusting step S42, a peripheral portion on the front surface $11a$ side of the first device wafer 11 and a peripheral portion on the front surface $21a$ side of the second device wafer 21 are imaged by using the microscope camera unit 32 including an infrared camera, and the relative position of the second device wafer 21 with respect to the first device wafer 11 is adjusted. By thus using the infrared camera, it is possible to image the front surface $11a$ side in such a manner as to penetrate the first device wafer 11, and image the front surface $21a$ side. Thereafter, a laminated device wafer in which the front surface $11a$ side and the front surface $21a$ side are laminated to each other can be formed by undergoing the lowering and fixing step S44 and the peeling step S50.

(Second Modification)

In addition, in a case where the circuit pattern on the front surface $11a$ side and the circuit pattern on the front surface $21a$ side are mirror image objects, as described above, the back surface $11b$ side and the back surface $21b$ side can be laminated to each other. In a case where the back surface $11b$ side and the back surface $21b$ side are to be laminated to each other, the first device wafer 11 is prepared which is thinned by undergoing steps from the removing step S10 to the thinning step S30 described above and whose front surface $11a$ side is fixed to the provisional fixing substrate 33.

In addition, the second device wafer 21 is prepared which is similarly thinned by grinding the back surface $21b$ side of the second device wafer 21 whose front surface $21a$ side is fixed to a provisional fixing substrate (not depicted) by a provisional adhesive layer 35 after the chamfered portion on the front surface $21a$ side is removed. Incidentally, when the chamfered portion on the front surface $21a$ side is removed, a removal range on the front surface $21a$ side is adjusted such that the diameter of the second device wafer 21 after being thinned is larger than the diameter of the first device wafer 11.

Then, the provisional fixing substrate 33 on the first device wafer 11 provided with the adhesive layer 37 on the back surface $11b$ side is sucked and held by the holding unit, the provisional fixing substrate fixed to the second device wafer 21 is sucked and held by the holding table, and the first device wafer 11 is disposed above the second device wafer 21. Next, the adhesive layer 37 on the first device wafer 11 and the back surface 21b of the second device wafer 21 are made to face and approach each other such that the adhesive layer 37 and the back surface 21b are separated from each other by at least the distance 39a of a few micrometers.

In particular, in the position adjusting step S42, a peripheral portion on the front surface 11a side of the first device wafer 11 and a peripheral portion on the front surface 21a side of the second device wafer 21 are imaged by using the microscope camera unit 32 including an infrared camera, and the relative position of the second device wafer 21 with respect to the first device wafer 11 is adjusted. By thus using the infrared camera, it is possible to image the front surface 21a side in such a manner as to penetrate the second device wafer 21, and image the front surface 11a side. Thereafter, a laminated device wafer in which the back surface 11b side and the back surface 21b side are laminated to each other can be formed by undergoing the lowering and fixing step S44 and the peeling step S50.

(Third Modification)

In addition, the front surface 11a side of the first device wafer 11 and the back surface 21b side of the second device wafer 21 may be laminated to each other. In this case, as in the first modification, the provisional fixing substrate 33 is fixed to the back surface 11b side of the first device wafer 11 after the thinning step S30 via the provisional adhesive layer 35 (provisional fixing step). In addition, as in the second modification, a thinned second device wafer 21 is prepared by grinding the back surface 21b side of the second device wafer 21 whose front surface 21a side is fixed to a provisional fixing substrate (not depicted) by a provisional adhesive layer 35 after the chamfered portion on the front surface 21a side is removed. Incidentally, as in the second modification, the diameter of the second device wafer 21 after being thinned is made larger than the diameter of the first device wafer 11.

Then, the provisional fixing substrate 33 on the first device wafer 11 provided with the adhesive layer 37 on the front surface 11a side is sucked and held by the holding unit, the provisional fixing substrate fixed to the second device wafer 21 is sucked and held by the holding table, and the first device wafer 11 is disposed above the second device wafer 21. Next, the adhesive layer 37 on the first device wafer 11 and the back surface 21b of the second device wafer 21 are made to face and approach each other such that the adhesive layer 37 and the back surface 21b are separated from each other by at least the distance 39a of a few micrometers.

In particular, in the position adjusting step S42, a peripheral portion on the front surface 11a side of the first device wafer 11 and a peripheral portion on the front surface 21a side of the second device wafer 21 are imaged by using the microscope camera unit 32 including an infrared camera, and the relative position of the second device wafer 21 with respect to the first device wafer 11 is adjusted. By thus using the infrared camera, it is possible to image the front surface 11a side and the front surface 21a side in such a manner as to penetrate the first device wafer 11 and the second device wafer 21. Thereafter, a laminated device wafer in which the front surface 11a side and the back surface 21b side are laminated to each other can be formed by undergoing the lowering and fixing step S44 and the peeling step S50.

Second Embodiment

A second embodiment will next be described. FIG. 10 is a flowchart of a method of forming the laminated device wafer 23 according to the second embodiment. In the second embodiment, first, the front surface 11a side is fixed to the provisional fixing substrate 33 via the provisional adhesive layer 35 (provisional fixing step S20). Next, a first modified layer 43a and second modified layers 43b (see FIG. 12 and FIG. 13) are formed in a peripheral portion of the first device wafer 11 along a first planned processing line 45a and second planned processing lines 45b (see FIG. 11) (modified layer forming step S22).

Figure 11:
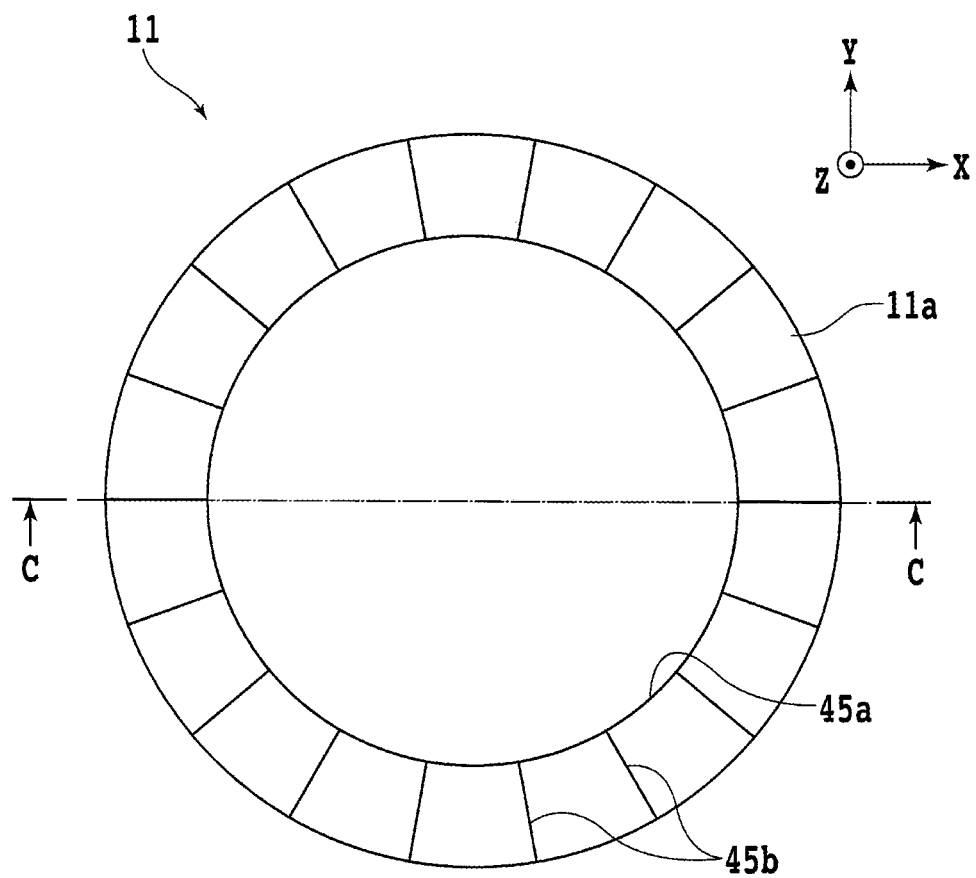
FIG. 11 is a top view of a first device wafer, the top view depicting a first planned processing line and second planned processing lines.

FIG. 11 is a top view of the first device wafer 11, the top view depicting the first planned processing line 45a and the second planned processing lines 45b in which modified layers 43 (see FIG. 13) are respectively formed. Incidentally, the planned dividing lines 15, the devices 19, and the like are omitted in FIG. 11. The modified layer forming step S22 uses a laser processing apparatus 40 (see FIG. 12). The laser processing apparatus 40 has a disk-shaped chuck table (not depicted). A rotational driving source (not depicted) such as a motor is provided to a lower portion of the chuck table. The chuck table is rotatable about a rotational axis 42. In addition, a ball screw type processing feed mechanism (X-axis direction moving mechanism) is provided to the lower portion of the chuck table. A laser beam irradiating unit 44 is disposed above the chuck table. The laser beam irradiating unit 44 includes a laser oscillator (not depicted) and a condenser 46 including a condensing lens (not depicted).

Figure 12:
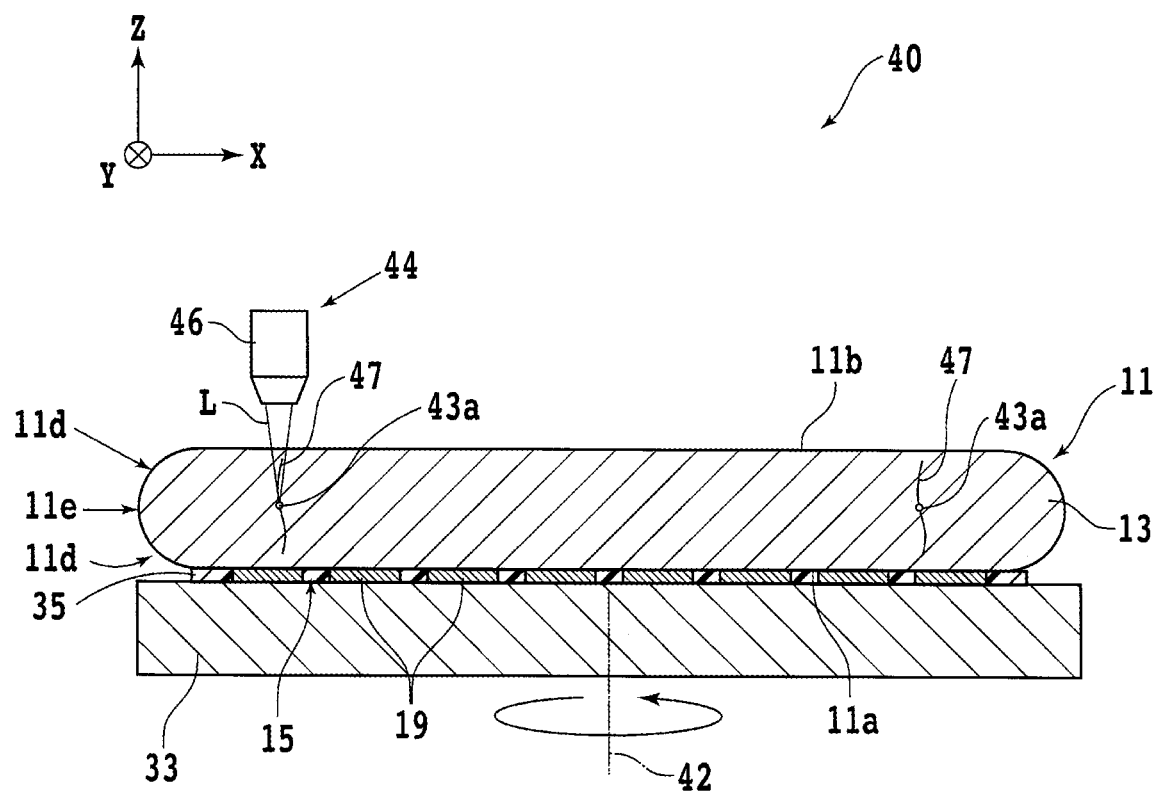
FIG. 12 depicts a manner in which a first modified layer is formed.

In the modified layer forming step S22, an annular first modified layer 43a is formed by applying a laser beam L along an annular first planned processing line 45a (see FIG. 11) located inward of the peripheral edge 11e by a predetermined distance in the radial direction of the first device wafer 11. FIG. 12 is a diagram depicting a manner in which the first modified layer 43a is formed. FIG. 12 corresponds to a sectional view taken along a line C-C of FIG. 11. In order to form the first modified layer 43a, first, the provisional fixing substrate 33 fixed to the first device wafer 11 is sucked and held by the holding surface of the chuck table. Next, the condenser 46 is disposed directly above the first planned processing line 45a, and the condensing point of the pulsed laser beam L having a wavelength transmitted through the wafer 13 is positioned at a predetermined depth in the thickness direction of the wafer 13. In this state, the first device wafer 11 is rotated about the rotational axis 42. Processing conditions are set as in the following, for example.

Wavelength: 1064 nm
Average power: 1 W
Repetition frequency: 100 kHz
Rotational speed: 180°/s Multiphoton absorption occurs at the condensing point and vicinities thereof. Thus, the annular first modified layer 43a is formed along the first planned processing line 45a. Incidentally, a plurality of first modified layers 43a may be formed in the thickness direction of the wafer 13 by changing the depth position of the condensing point. In FIG. 12, the first modified layer 43a is represented by a circle for convenience. When the first modified layer 43a is formed, a crack 47 extending toward the front surface 11a and the back surface 11b is formed with the first modified layer 43a as a starting point. In the modified layer forming step S22, further, second modified layers 43b are formed by applying the laser beam L along a plurality of second planned processing lines 45b (eighteen second planned processing lines 45b in the example depicted in FIG. 11) set radially at substantially equal intervals along the peripheral edge 11e in an annular region from the first planned processing line 45a to the peripheral edge 11e.

Figure 13:
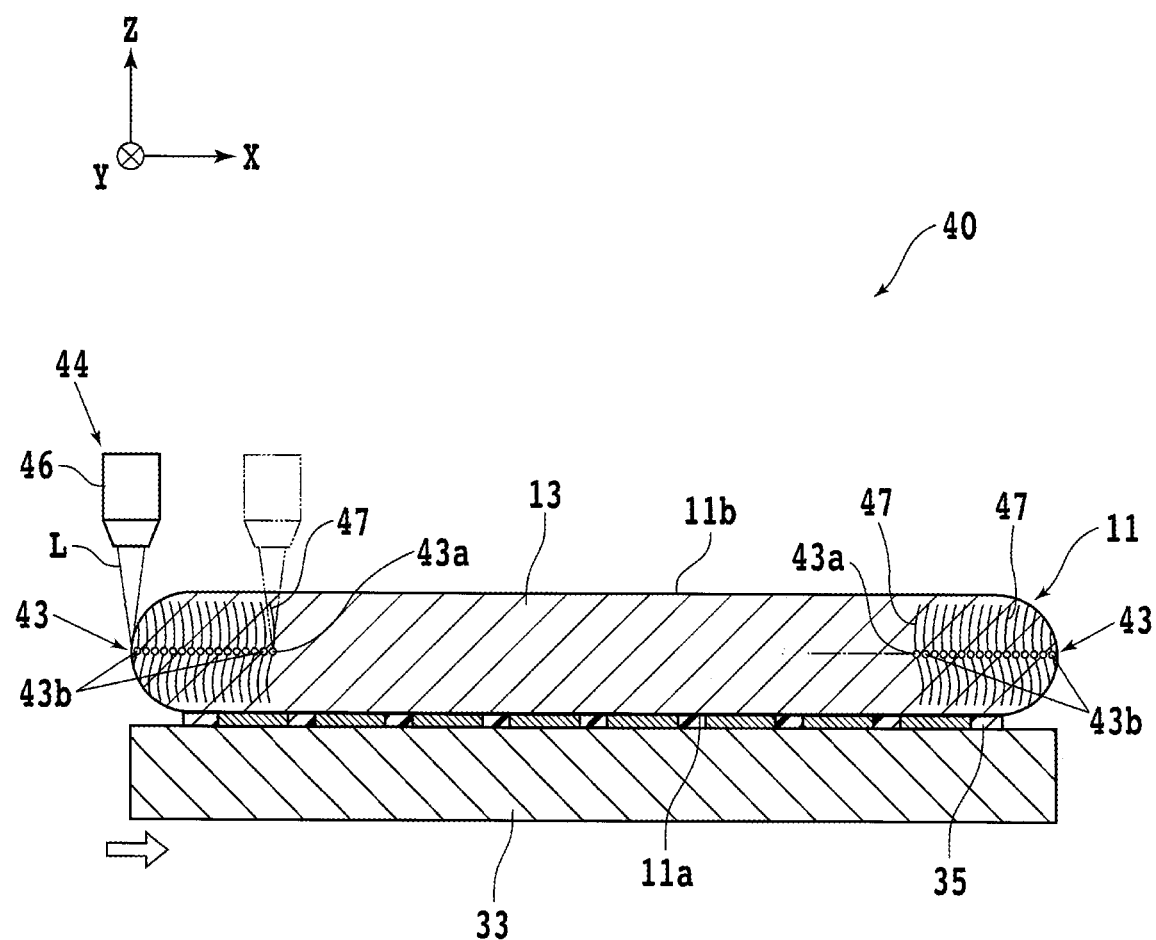
FIG. 13 depicts a manner in which a second modified layer is formed.

FIG. 13 is a diagram depicting a manner in which a second modified layer 43b is formed. FIG. 13 corresponds to a sectional view taken along the line C-C of FIG. 11. In order to form the second modified layers 43b, first, the orientation of the chuck table is adjusted such that one second planned processing line 45b is substantially parallel with the X-axis direction. Then, the condensing point of the laser beam L is positioned at a predetermined depth below the one second planned processing line 45b, and the chuck table is moved along the X-axis direction such that the condensing point moves from one end to another end of the one second planned processing line 45b. Processing conditions are set as in the following, for example.

Wavelength: 1064 nm
Average power: 1 W
Repetition frequency: 100 kHz
Processing feed speed: 800 mm/s The second modified layers 43b are thus formed along all of the second planned processing lines 45b. In FIG. 13, one second modified layer 43b is represented by a plurality of circles for convenience. When the second modified layers 43b are formed, cracks 47 extending toward the front surface 11a and the back surface 11b are formed with the second modified layers 43b as a starting point. Incidentally, the modified layers 43 refer to, for example, regions having a weak mechanical strength as compared with regions not irradiated with the laser beam L, and serving as starting points for the cracks 47. After the modified layer forming step S22, the back surface 11b side of the first device wafer 11 is thinned by grinding (thinning step S30; see FIG. 4A and FIG. 4B). In the thinning step S30, with an impact of grinding, the cracks 47 extend with the first modified layer 43a and the second modified layers 43b as starting points. Then, the peripheral portion of the first device wafer 11 is separated and removed by vibration, centrifugal force, and the like acting on the first device wafer 11 at a time of the grinding. Processing after the laminating step S40 is the same as in the first embodiment, and therefore description thereof will be omitted.

Also in the second embodiment, the first device wafer 11 and the second device wafer 21 can be aligned with each other without alignment marks being formed within the rectangular regions 19A corresponding to the devices 19. Hence, a photolithography process for forming the alignment marks can be omitted, and the effective area of the device 19 is not decreased by the alignment marks. Also in the second embodiment, the front surface 11a side and the front surface 21a side may be laminated to each other as described in the first modification, the back surface 11b side and the back surface 21b side may be laminated to each other as described in the second modification, or the front surface 11a side and the back surface 21b side may be laminated to each other as described in the third modification.

Figure 14A:
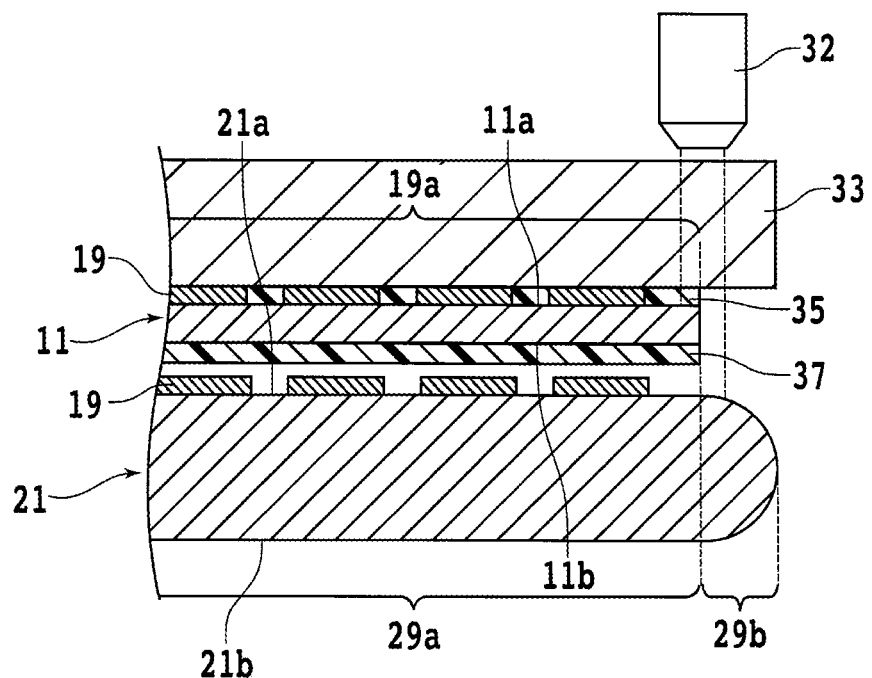
FIG. 14A depicts a case where the position adjusting step is performed by using a device region and a peripheral surplus region.

Two examples with regard to the position adjusting step S42 will next be described with reference to FIG. 14A and FIG. 14B. FIG. 14A is a diagram depicting a case where the position adjusting step S42 is performed by using a device region 19a and a peripheral surplus region 29b. A circular device region 19a in which a plurality of devices 19 are formed is present on the front surface 11a side of the first device wafer 11. In addition, an annular peripheral surplus region is present on the outside of the device region 19a in the radial direction of the first device wafer 11. Similarly, a circular device region 29a in which a plurality of devices 19 are formed is present on the front surface 21a side of the second device wafer 21. In addition, a peripheral surplus region 29b is present on the outside of the device region 29a in the radial direction of the second device wafer 21.

In general, a manufacturer does not guarantee flatness of an annular region up to 2.0 mm inward from a peripheral edge along a diametrical direction on the front surface side of a wafer having a diameter of 300 mm (12 inches). This annular region is generally referred to as a peripheral surplus region. Planned dividing lines 15, devices 19, a wiring layer, circuits, and the like are not formed in the peripheral surplus region in the first place, or even when if planned dividing lines 15, devices 19, a wiring layer, circuits, and the like are formed in the peripheral surplus region, the circuits and the like formed in the peripheral surplus region are ultimately not used as device chips. In addition, although the device region includes an annular region in a range of 1.0 mm further inward of the peripheral surplus region along the diametrical direction (that is, an annular region up to 3.0 mm inward from the peripheral edge 11e along the diametrical direction), circuits and the like located in the annular region are ultimately not used as device chips.

In consideration of the above-described conditions, first, referring to FIG. 14A, description will be made of a case where the second planned dividing line $15a_2$ and the fourth planned dividing line $15b_4$ on the second device wafer 21 are formed from the device region 29a through the peripheral surplus region 29b. In this case, the position adjusting step S42 can be performed by using the first planned dividing line $15a_1$ and the third planned dividing line $15b_3$ formed on the peripheral portion on the front surface 11a side of the first device wafer 11 and the second planned dividing line $15a_2$ and the fourth planned dividing line $15b_4$ formed on the peripheral portion on the front surface 21a side of the second device wafer 21.

Figure 14B:
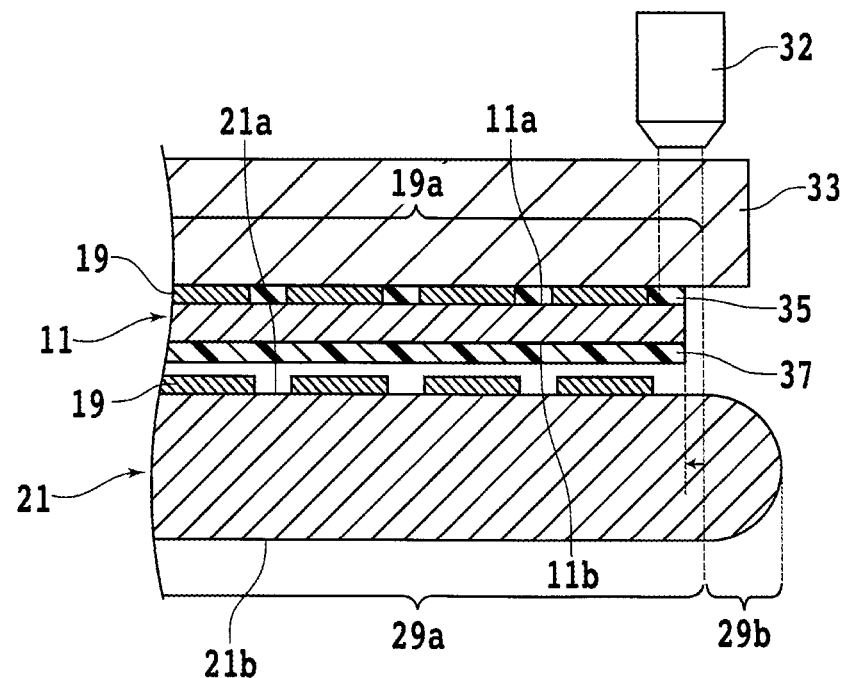
FIG. 14B depicts a case where the position adjusting step is performed by using device regions.

However, as depicted in FIG. 14B, there is also a case where the second planned dividing line $15a_2$ and the fourth planned dividing line $15b_4$ on the second device wafer 21 are formed on a peripheral portion of the device region 29a but are not formed on the peripheral surplus region 29b. In this case, as depicted in FIG. 14B, the peripheral portion of the device region 29a is exposed on the outside of the device region 19a by further reducing the diameter of the device region 19a depicted in FIG. 14A by 1.0 mm (see a leftward arrow in FIG. 14B).

FIG. 14B is a diagram depicting a case where the position adjusting step S42 is performed using the device regions 19a and 29a. The positions of the first device wafer 11 and the second device wafer 21 are adjusted while the respective peripheral portions of the device regions 19a and 29a are imaged by the microscope camera unit 32. Also in the case of each of FIG. 14A and FIG. 14B, the first device wafer 11 and the second device wafer 21 can be aligned with each other without alignment marks being formed within the rectangular regions 19A corresponding to the devices 19. In addition, also in the cases of FIG. 14A and FIG. 14B, the front surface 11a side and the front surface 21a side may be laminated to each other as described in the first modification, the back surface 11b side and the back surface 21b side may be laminated to each other as described in the second modification, or the front surface 11a side and the back surface 21b side may be laminated to each other as described in the third modification.

Third Embodiment

Figure 15:
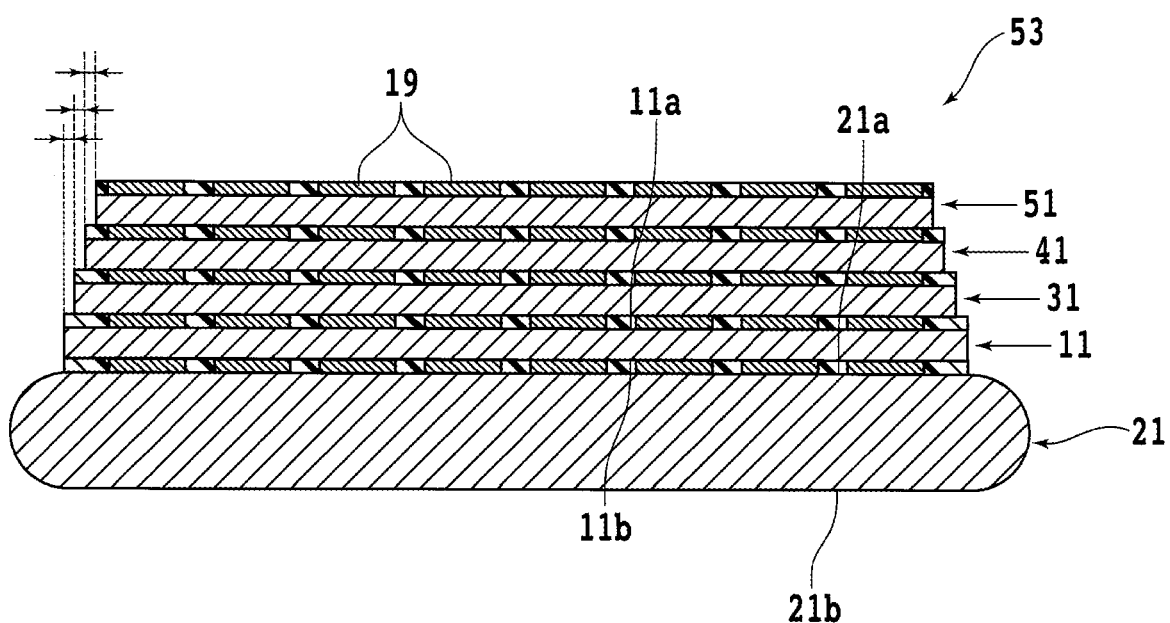
FIG. 15 is a sectional view of a laminated device wafer according to a third embodiment in which five device wafers are laminated.

An example of laminating three or more device wafers will next be described. FIG. 15 is a sectional view of a laminated device wafer 53 in which five device wafers (a first device wafer 11, a second device wafer 21, a third device wafer 31, a fourth device wafer 41, and a fifth device wafer 51) according to a third embodiment are laminated. As depicted in FIG. 15, the method of the laminating step S40 can be applied by making the diameter of a thinned upper device wafer smaller than the diameter of a lower device wafer. Hence, the device wafers adjacent to each other in a lamination direction can be aligned with each other without alignment marks being formed within the rectangular regions 19A corresponding to the devices 19. In addition, which of the front surfaces and back surfaces of the device wafers are to be oriented upward (or downward) may be determined as appropriate.

Besides, structures, methods, and the like according to the foregoing embodiment can be modified and implemented as appropriate without departing from the objective scope of the present invention. In place of the above-described removing step S10, at least the chamfered portion 11$d$ formed on the peripheral portion on the front surface 11$a$ side may be removed by laser ablation using a pulsed laser beam having a wavelength (for example, 355 nm) absorbed by the first device wafer 11. In addition, in place of the above-described removing step S10, at least the chamfered portion 11$d$ formed on the peripheral portion on the front surface 11$a$ side may be removed by plasma etching. That is, laser ablation or plasma etching may be used in the removing step S10 that processes the first device wafer 11.

Further, the laminating step S40 may form a silicon oxide layer on the back surface 11$b$ side of the first device wafer 11 in place of the adhesive layer 37, further form a silicon oxide layer also on the front surface 21$a$ side of the second device wafer 21, planarize the silicon oxide layers, and then bond the silicon oxide layers to each other.

Incidentally, the position adjusting step S42 may image the front surface 11$a$ side and the front surface 21$a$ side in different timing rather than at the same time by moving the focus of the microscope camera unit 32 in the Z-axis direction after imaging the front surface 11$a$ side, and then imaging the front surface 21$a$ side. However, the positional adjustment is easier when the imaging is performed at the same time.

In addition, the position adjusting step S42 can also use a predetermined pattern such as a test element group (TEG), a memory cell, a core including a row decoder, a column decoder, and the like, a peripheral, or a wiring layer, in place of the first to fourth planned dividing lines 15$a_1$ to 15$b_4$ or together with the first to fourth planned dividing lines 15$a_1$ to 15$b_4$. That is, the first to fourth predetermined lines used for positional adjustment of the first device wafer 11 and the second device wafer 21 are not limited to planned dividing lines 15 and any pattern located outside the rectangular regions 19A corresponding to the devices 19 can be used as the first to fourth predetermined lines.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A laminated device wafer forming method for forming a laminated device wafer in which a plurality of device wafers are laminated by laminating a first device wafer and a second device wafer to each other, the first device wafer and the second device wafer having a plurality of planned dividing lines set in a lattice manner on front surfaces of the first device wafer and the second device wafer and each having a device formed in each of a plurality of regions each in a rectangular shape, the plurality of regions being demarcated by the plurality of planned dividing lines, the laminated device wafer forming method comprising:
    a removing step of removing at least a chamfered portion formed on a peripheral portion on the front surface side of the first device wafer by processing the first device wafer;
    a thinning step of grinding and thinning a back surface side of the first device wafer after the removing step; and
    a laminating step of laminating the first device wafer and the second device wafer to each other after the thinning step;
    the laminating step including a position adjusting step of imaging, by an imaging unit, a first predetermined line formed on a peripheral portion on the front surface side of the first device wafer and located outside the rectangular regions corresponding to the devices and a second predetermined line formed on a peripheral portion on the front surface side of the second device wafer and located outside the rectangular regions corresponding to the devices, and adjusting relative positions of the first device wafer and the second device wafer by using the first predetermined line and the second predetermined line.

2. The laminated device wafer forming method according to claim 1, wherein
    the laminating step laminates the back surface side of the first device wafer and the front surface side of the second device wafer to each other.

3. The laminated device wafer forming method according to claim 1, wherein
    the position adjusting step images the first predetermined line and the second predetermined line simultaneously by the imaging unit.

4. The laminated device wafer forming method according to claim 1, wherein
    the first predetermined line is a first planned dividing line set on the front surface of the first device wafer,
    the second predetermined line is a second planned dividing line set on the front surface of the second device wafer,
    the first planned dividing line and the second planned dividing line have a same shape and a same size, and
    the position adjusting step aligns the first planned dividing line and the second planned dividing line with each other.

5. The laminated device wafer forming method according to claim 1, wherein
    the position adjusting step adjusts the relative positions of the first device wafer and the second device wafer by using, in addition to the first predetermined line and the second predetermined line, a third predetermined line set in orthogonal positional relation to the first predetermined line, formed on the peripheral portion on the front surface side of the first device wafer, and located outside the rectangular regions corresponding to the devices, and a fourth predetermined line set in orthogonal positional relation to the second predetermined line, formed on the peripheral portion on the front surface side of the second device wafer, and located outside the rectangular regions corresponding to the devices.

6. A laminated device wafer forming method for forming a laminated device wafer in which a plurality of device wafers are laminated by laminating a first device wafer and a second device wafer to each other, the first device wafer and the second device wafer having a plurality of planned dividing lines set in a lattice manner on front surfaces of the first device wafer and the second device wafer and each having a device formed in each of a plurality of rectangular regions demarcated by the plurality of planned dividing lines, the laminated device wafer forming method comprising:

- a modified layer forming step of positioning a condensing point of a laser beam having a wavelength transmitted through the first device wafer at a predetermined depth in a thickness direction of the first device wafer in a peripheral portion of the first device wafer, and forming a modified layer;
- a thinning step of grinding and thinning a back surface side of the first device wafer and removing the peripheral portion of the first device wafer after the modified layer forming step; and
- a laminating step of laminating the first device wafer and the second device wafer to each other after the thinning step;
- the laminating step including a position adjusting step of imaging, by an imaging unit, a first predetermined line formed on a peripheral portion on the front surface side of the first device wafer and located outside the rectangular regions corresponding to the devices and a second predetermined line formed on a peripheral portion on the front surface side of the second device wafer and located outside the rectangular regions corresponding to the devices, and adjusting relative positions of the first device wafer and the second device wafer by using the first predetermined line and the second predetermined line.

* * * * *